United States Patent [19]

Braceras et al.

[11] Patent Number: 5,638,315
[45] Date of Patent: Jun. 10, 1997

[54] CONTENT ADDRESSABLE MEMORY FOR A DATA PROCESSING SYSTEM

[75] Inventors: George M. Braceras, Colchester; Donald A. Evans, Williston; Reid A. Wistort, Westford, all of Vt.

[73] Assignee: International Business Machines Corporation, Armonk, N.Y.

[21] Appl. No.: 527,480

[22] Filed: Sep. 13, 1995

[51] Int. Cl.[6] .................................................. G11C 15/00
[52] U.S. Cl. .................. 365/49; 365/189.07; 365/189.08
[58] Field of Search .......................... 365/49, 189.07, 365/189.08; 395/435

[56] References Cited

U.S. PATENT DOCUMENTS

| | | |
|---|---|---|
| 4,151,593 | 4/1979 | Jenkins et al. . |
| 4,899,275 | 2/1990 | Sachs et al. . |
| 4,914,577 | 4/1990 | Stewart et al. . |
| 5,034,919 | 7/1991 | Sasai et al. . |
| 5,173,872 | 12/1992 | Crawford et al. . |
| 5,226,009 | 7/1993 | Arimoto . |
| 5,267,190 | 11/1993 | Easley et al. . |
| 5,289,403 | 2/1994 | Yetter . |
| 5,299,147 | 3/1994 | Holst .................................. 365/49 |
| 5,396,448 | 3/1995 | Takayanagi et al. ............... 365/49 |
| 5,428,565 | 6/1995 | Shaw .................................. 365/49 |
| 5,483,479 | 1/1996 | Osawa et al. ...................... 365/49 |

*Primary Examiner*—David C. Nelms
*Assistant Examiner*—Huan Hoang
*Attorney, Agent, or Firm*—Jenkens & Gilchrist

[57] ABSTRACT

A fully associative CAM that removes the need for a strobe and improves the overall performance of the CAM. The inventive CAM takes advantage of the fact that only one entry, if any, of the CAM will match the applied address. If a CAM entry matches the applied address, then it can be assumed that the address did not match the other CAM entries. Therefore, to access a certain entry in the memory array, it can be determined that the match lines of the CAM entries not corresponding to this certain matching entry in memory have each left the precharged state. By using the other state information, the proper memory bits can be selected without the use of a strobe.

20 Claims, 11 Drawing Sheets

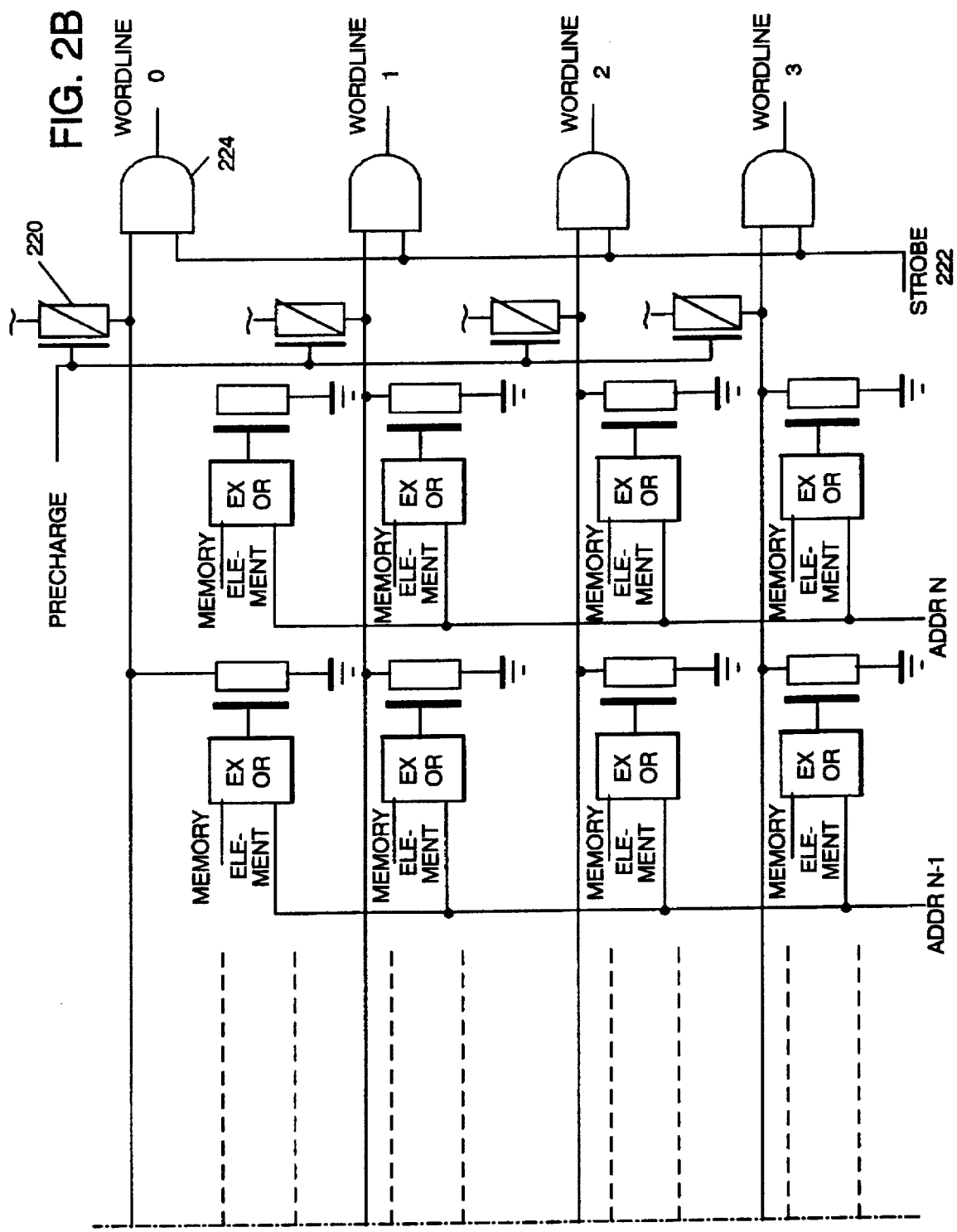

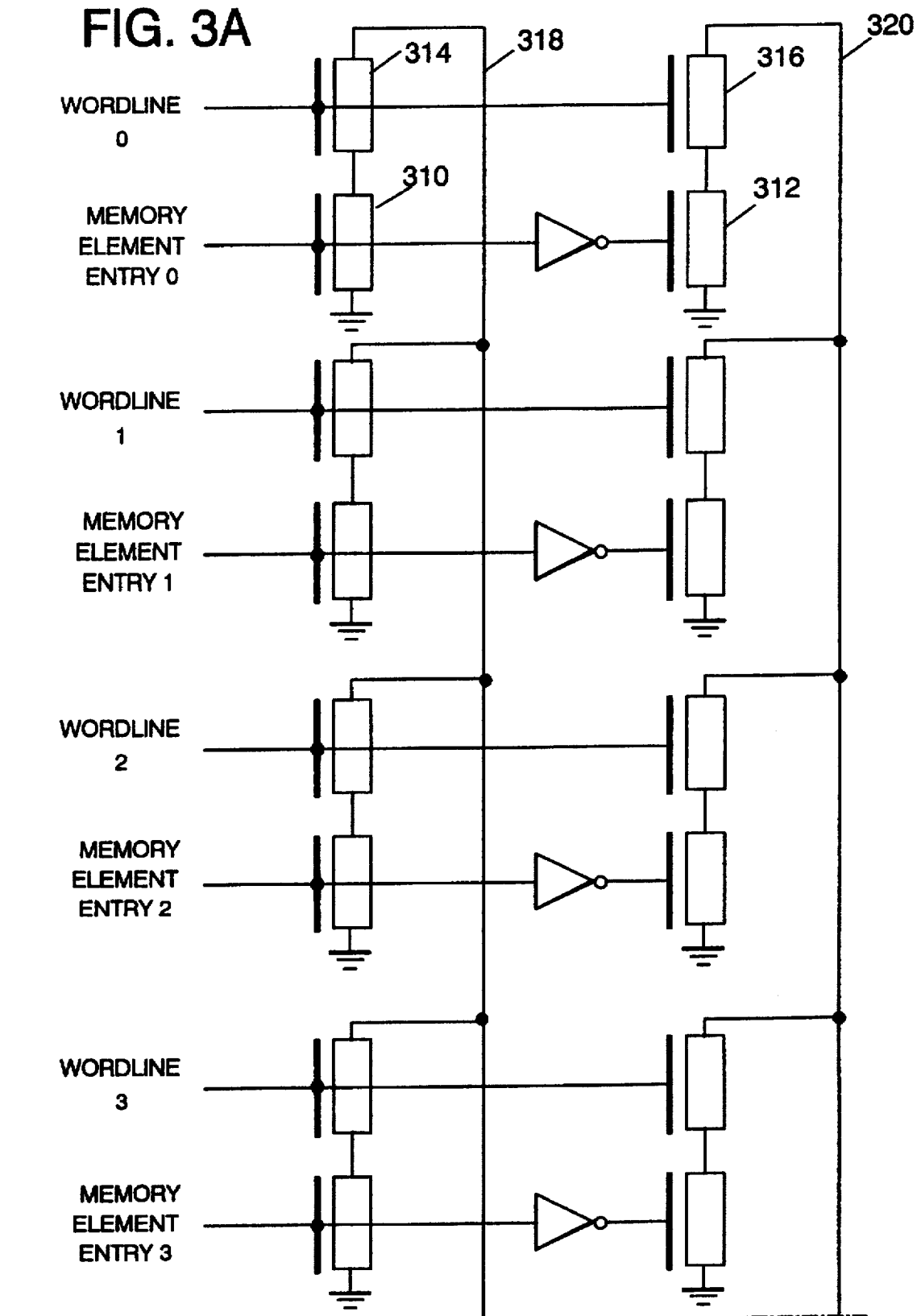

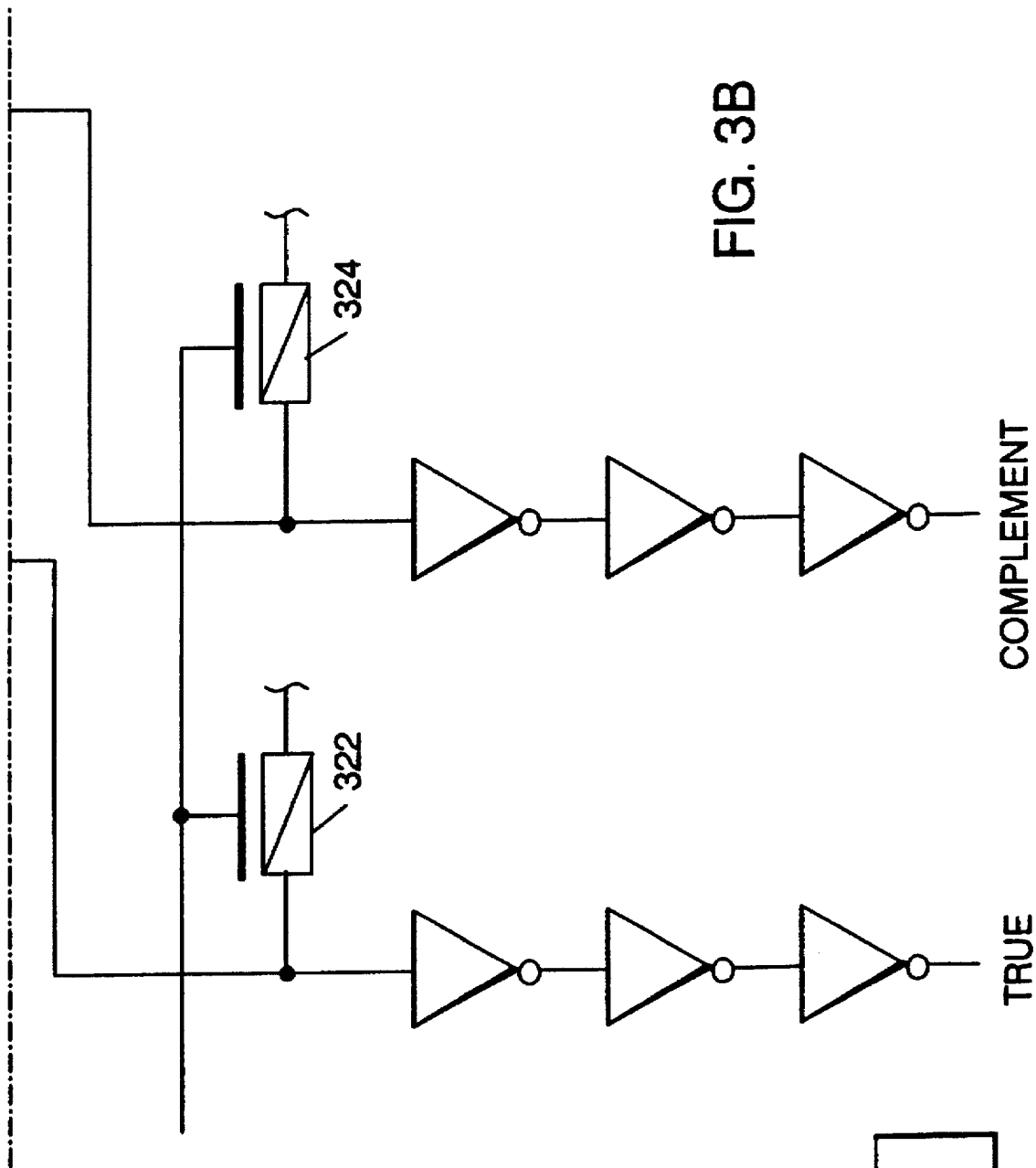
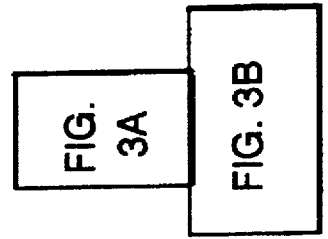
FIG. 3
PRIOR ART ary bit slice.
CONTENT ADDRESSABLE MEMORY FOR A DATA PROCESSING SYSTEM

TECHNICAL FIELD OF THE INVENTION

This invention pertains in general to data processing systems using high-speed memory to perform data lookups. More particularly, the present invention pertains to a fully-associative content addressable memory in such a system.

BACKGROUND OF THE INVENTION

A memory unit accessed by content, rather than by address or location, is called an associative memory or content addressable memory (CAM). A memory is fully-associative when any word can be held in any storage location.

When a word is to be read from a CAM, the content of the word, or part of the word, is specified. The memory locates the word which matches the specified content and marks it for reading.

FIG. 1 shows a block overview of the logical components necessary to implement a conventional CAM. Shown are address register 110, key register 112, compare array 114, and memory array 116. Such a CAM is well known in the prior art.

FIG. 2, consisting of FIGS. 2A AND 2B, shows a circuit implementing a prior art compare array like that of Block 114 in FIG. 1. Shown are a set of address lines, of which line 210 is a member, and a column of identical entries, such as entry 212. Entry 212 includes match line 0 and wordline 0.

Entry 212 also comprises a row of XOR gates and corresponding NFETs. Each XOR gate receives input from an address line and a memory element. The contents of the memory elements are set using circuitry not shown in the FIGURES. The output of each XOR gate drives an NFET whose drain is connected to a match line. Each match line is precharged by a PFET to a high state. In addition, each match line is AND'ed with a strobe to produce an output on a wordline.

XOR Gate 214, for example, receives input from address line 210 and memory element 216. Gate 214 drives NFET 218. The drain of NFET 218, in turn, is connected to match line 0. Match line 0 is precharged high by PFET 220. Match line 0 and strobe line 222 are input into AND gate 224. The output of AND gate 224 is wordline 0.

In use, the contents of address register 110 are masked by key register 112 and the resulting bits are applied to the address lines. Each match line is precharged high. Each XOR gate compares the signal on its address line with that of its memory element and drives an NFET with its output. If the XOR gate's output is high, then the NFET drives the match line low. Then, strobe 222 samples the match line of each entry in the CAM and the result is sent to memory array 116.

FIG. 3, consisting of FIGS. 3A AND 3B, shows a typical memory array bit slice of memory array 116 and identifies those elements necessary for an understanding of the prior art. As shown in FIG. 3, memory element entry 0 drives NFET 310 and the inverse of memory element 0 drives NFET 312. The drains of NFETs 310 and 312 are respectively connected to the sources of NFETs 314 and 316. NFETs 314 and 316 are driven by wordline 0. The drains of NFETs 314 and 316 are connected to bit lines 318 and 320, respectively. Bit lines 318 and 320 are precharged high by PFETs 322 and 324. The precharged bit lines are then inverted and become the true and complement outputs of the array bit slice.

In practice, a high wordline drives its associated NFETs, which, in turn, cause the true bit line to go to the inverse of the memory element and the complement bit line to go to the state of the memory element. Each bit line is then inverted, causing the output lines to reflect the state of the memory element.

The chief advantage of a CAM is that of speed. A CAM is uniquely suited to do parallel searches by data association. Moreover, the use of key register 112 allows searches on entire words or specific fields within a word. However, CAMs are generally more expensive than random access memories because each entry must have storage capability as well as logic circuits for matching. For this reason, CAMs are used in applications where the search time is very critical and must be very short, such as in a memory management unit associated with a CPU.

In prior art CAMs, the strobe had to be timed to occur after the slowest match line, otherwise the wordline might be placed in an incorrect state. However, a large time margin between the match line and the strobe subtracted from the performance of the CAM. Therefore, the timing of the strobe line was critical to CAM performance. This race condition between the match lines and the strobe added significant risk of error to the CAM design.

Therefore, there is a need in the art for a method and system of implementing a CAM which eliminates the race condition between the strobe and the match lines.

SUMMARY OF THE INVENTION

It is an object of the present invention to provide a more efficient data processing system.

It is another object of the present invention to provide a system implementing a fully-associative content addressable memory that eliminates the strobe and attendant race condition between the strobe and the match lines that is found in prior art content addressable memories.

These and other objects of the present invention are met by a system for implementing a fully associative CAM that removes the need for a strobe and improves the overall performance of the CAM. The inventive CAM takes advantage of the fact that only one entry, if any, of the CAM will match the applied address. If a CAM entry matches the applied address, then it can be assumed that the address did not match the other CAM entries. Therefore, to access a certain entry in the memory array, it can be determined that the match lines of the CAM entries not corresponding to this certain matching entry in memory have each left the precharged state. By using the other state information, the proper memory bits can be selected without the use of a strobe.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 3, consisting of FIGS. 3A and 3B illustrates a memory array bit slice of a conventional CAM;

DETAILED DESCRIPTION OF THE INVENTION

Figure 4:
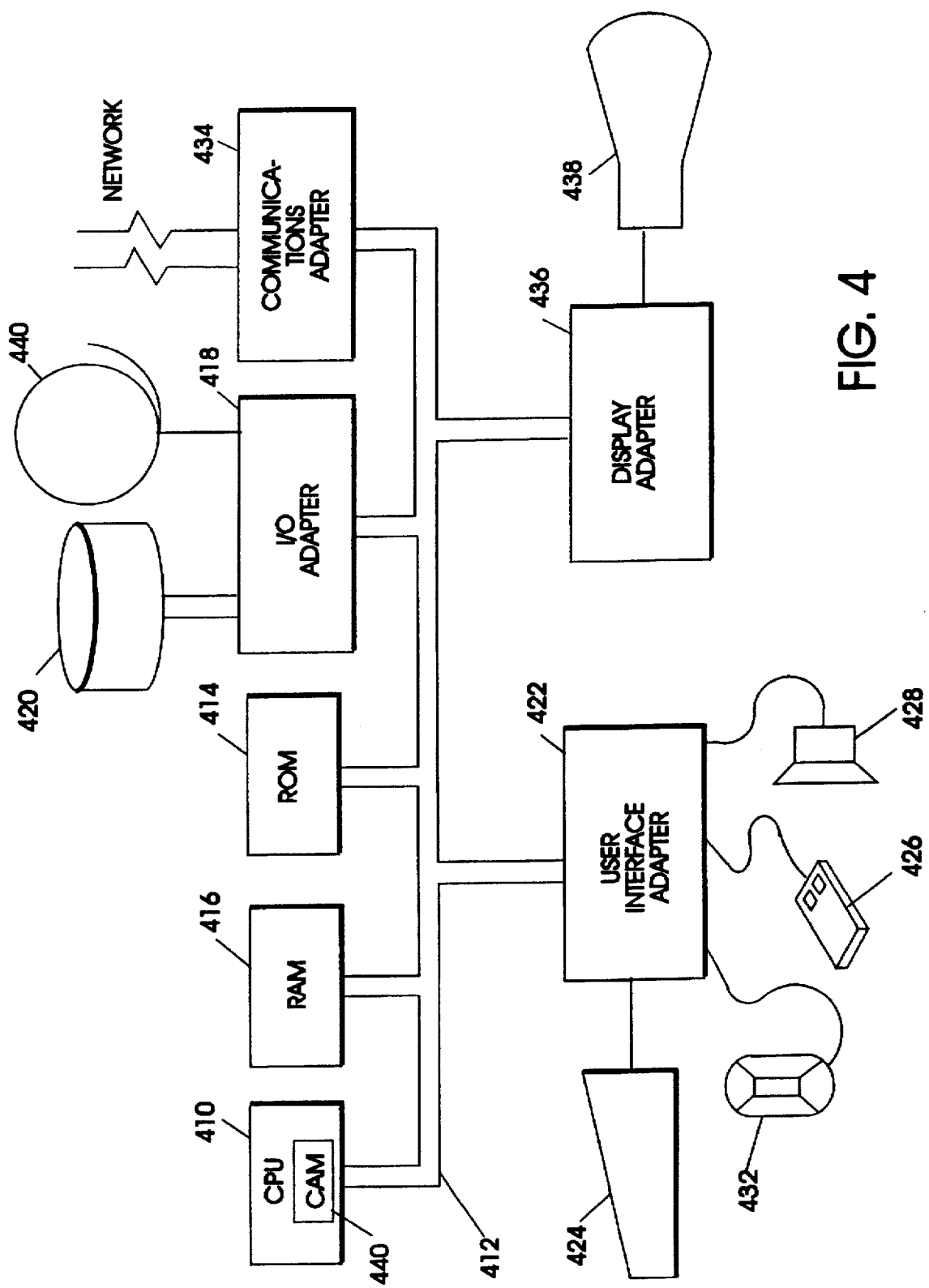
FIG. 4 illustrates a data processing system embodying the present invention.

A representative hardware environment for practicing the present invention is depicted in FIG. 4, which illustrates a typical hardware configuration of a workstation in accordance with the subject invention having at least one central processing unit (CPU) 410, such as a PowerPC microprocessor, and a number of other units interconnected via system bus 412. The workstation shown in FIG. 4 includes read only memory (ROM) 414, random access memory (RAM) 416, and input/output (I/O) adapter 418 for connecting peripheral devices such as disk units 420 and tape drives 440 to bus 412, user interface adapter 422 for connecting keyboard 424, mouse 426, speaker 428, microphone 432, and/or other user interface devices such as a touch screen device (not shown) to bus 412, communication adapter 434 for connecting the workstation to a data processing network, and display adapter 436 for connecting bus 412 to display device 438.

Figure 1:
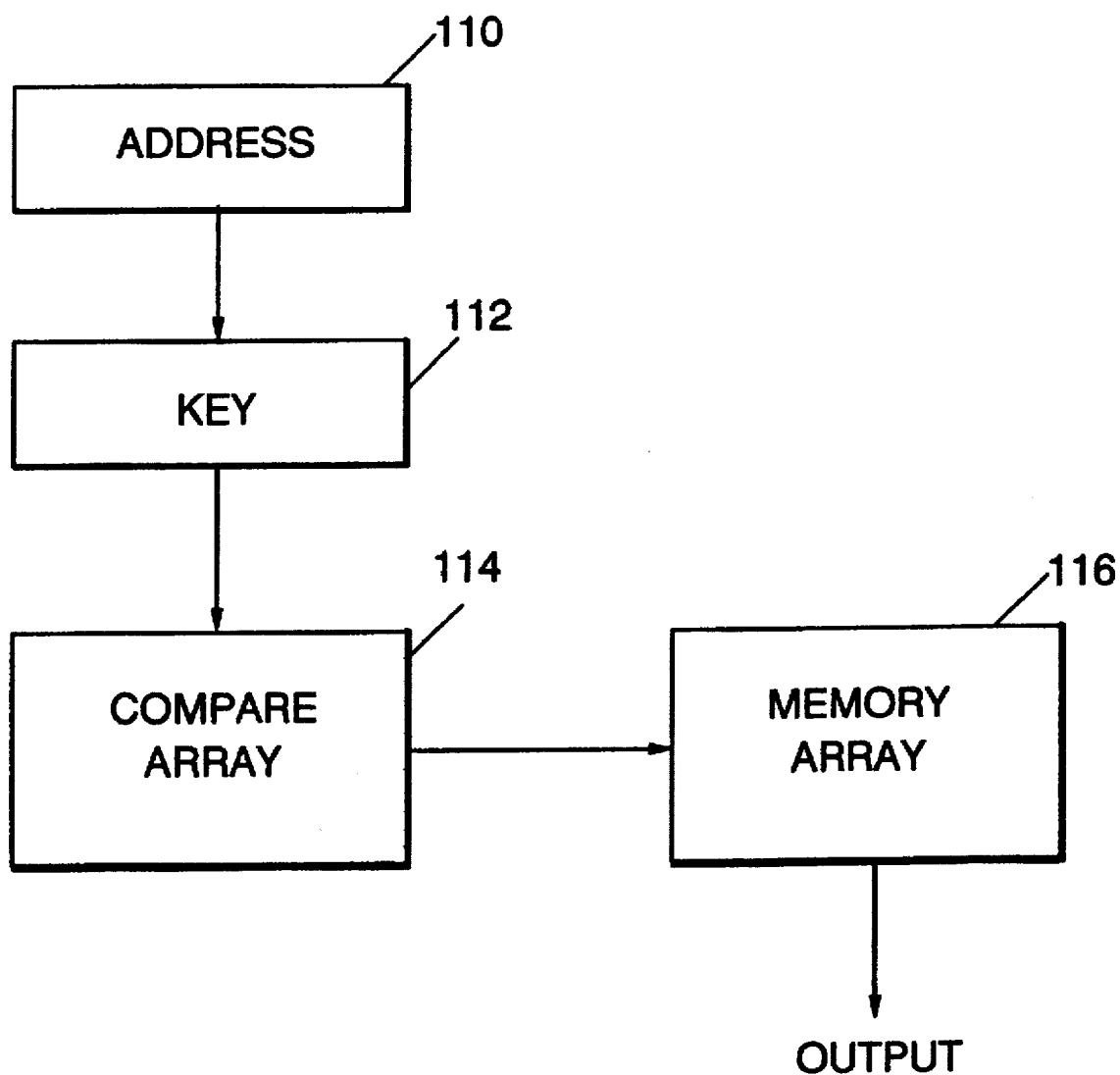
FIG. 1 illustrates a conventional content addressable memory (CAM)
Figures 2, 2A:
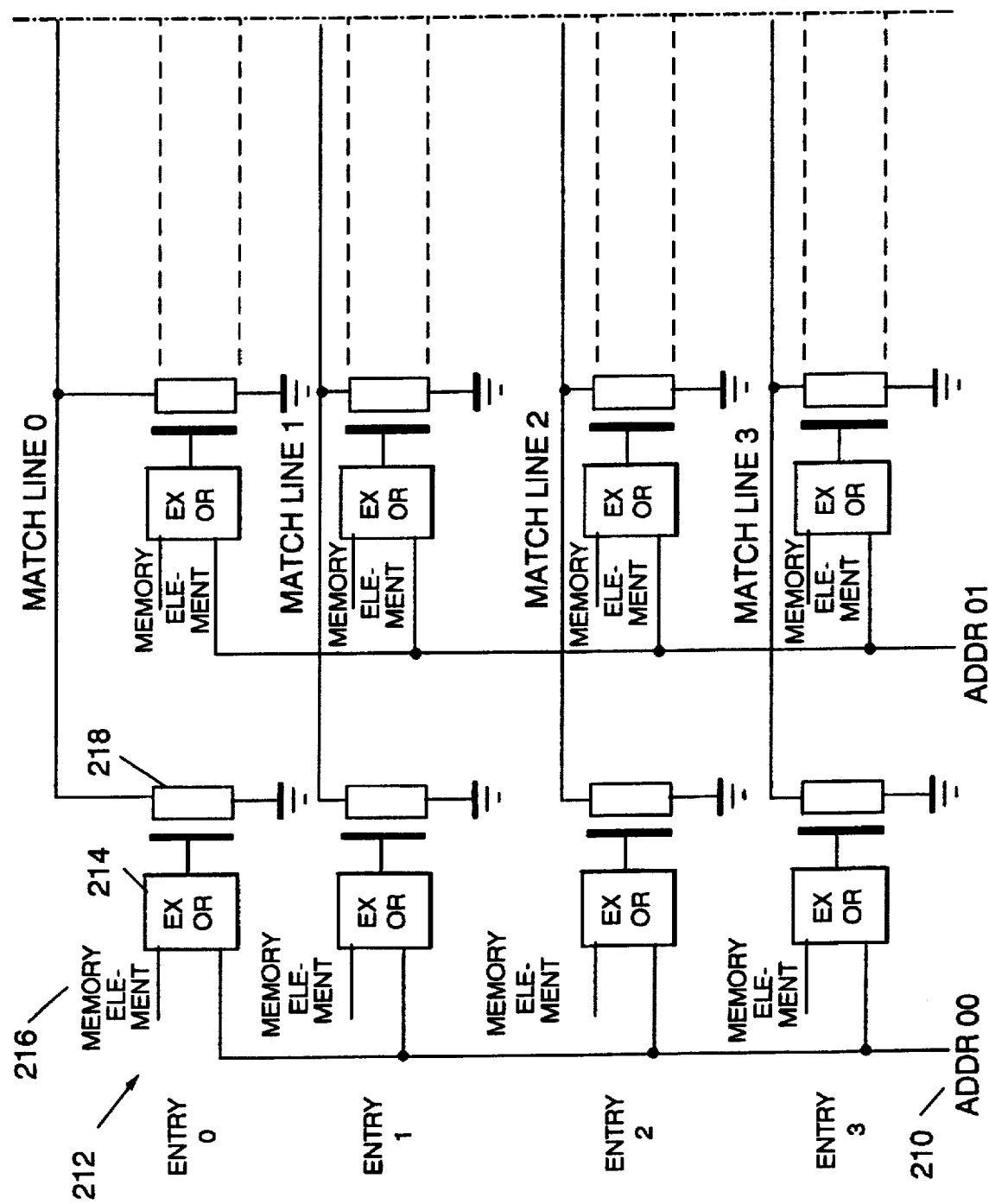
FIG. 2, consisting of FIGS. 2A and 2B illustrates a compare array of a conventional CAM.

Within CPU 410 is at least one content addressable memory (CAM) 440 embodying the present invention. CAM 440 is like the CAM shown in the high-level diagram of FIG. 1 in that CAM 440 has compare and memory arrays. CAM 440 is fully associative. CPU 410 can use CAM 440 for any purpose in which high speed data lookup is required. For example, a typical use would be as a block address translation unit.

Figure 5:
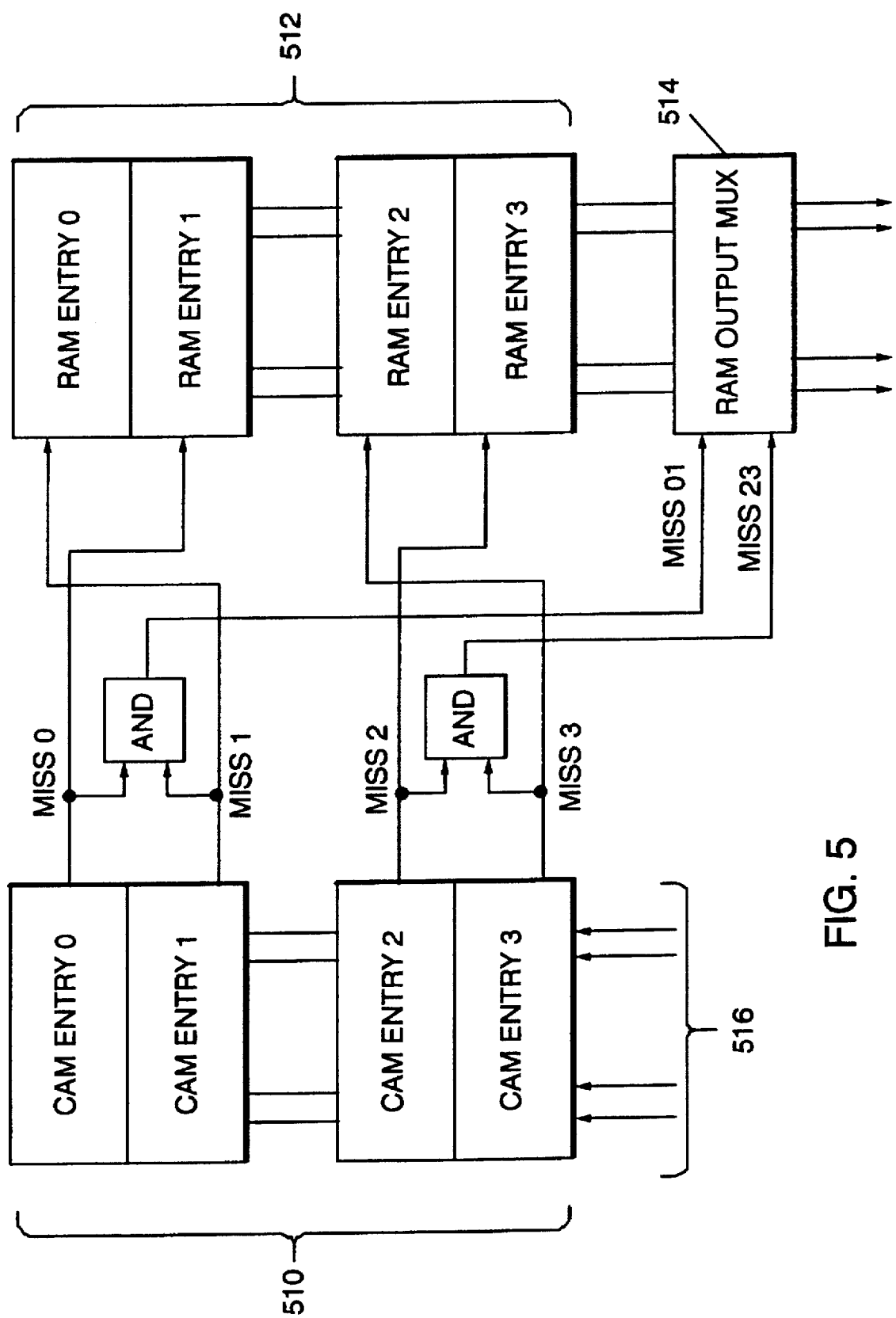
FIG. 5 illustrates a CAM of the present invention.

FIG. 5 shows an overview of CAM 440. FIG. 5 includes compare array 510, which has four entries 0-3, and memory array 512, which has four RAM entries 0-3 corresponding to the entries of compare array 510, and MUX 514 used to select among the RAM entries. Memory array 512 may be within RAM 416 or a separate memory space within CAM 440.

A plurality of address lines 516 are used to apply an address to compare array 510. Each entry in compare array 510 has a corresponding miss line that is asserted if the entry does not match the address. The miss line of entry 0 is connected with RAM entry 1 and the miss line of entry 1 is connected with RAM entry 0. In addition, the miss lines of entries 0 and 1 are AND'ed together and the resulting output is sent to MUX 514. Entries 2 and 3 are similarly configured.

Figure 6A:
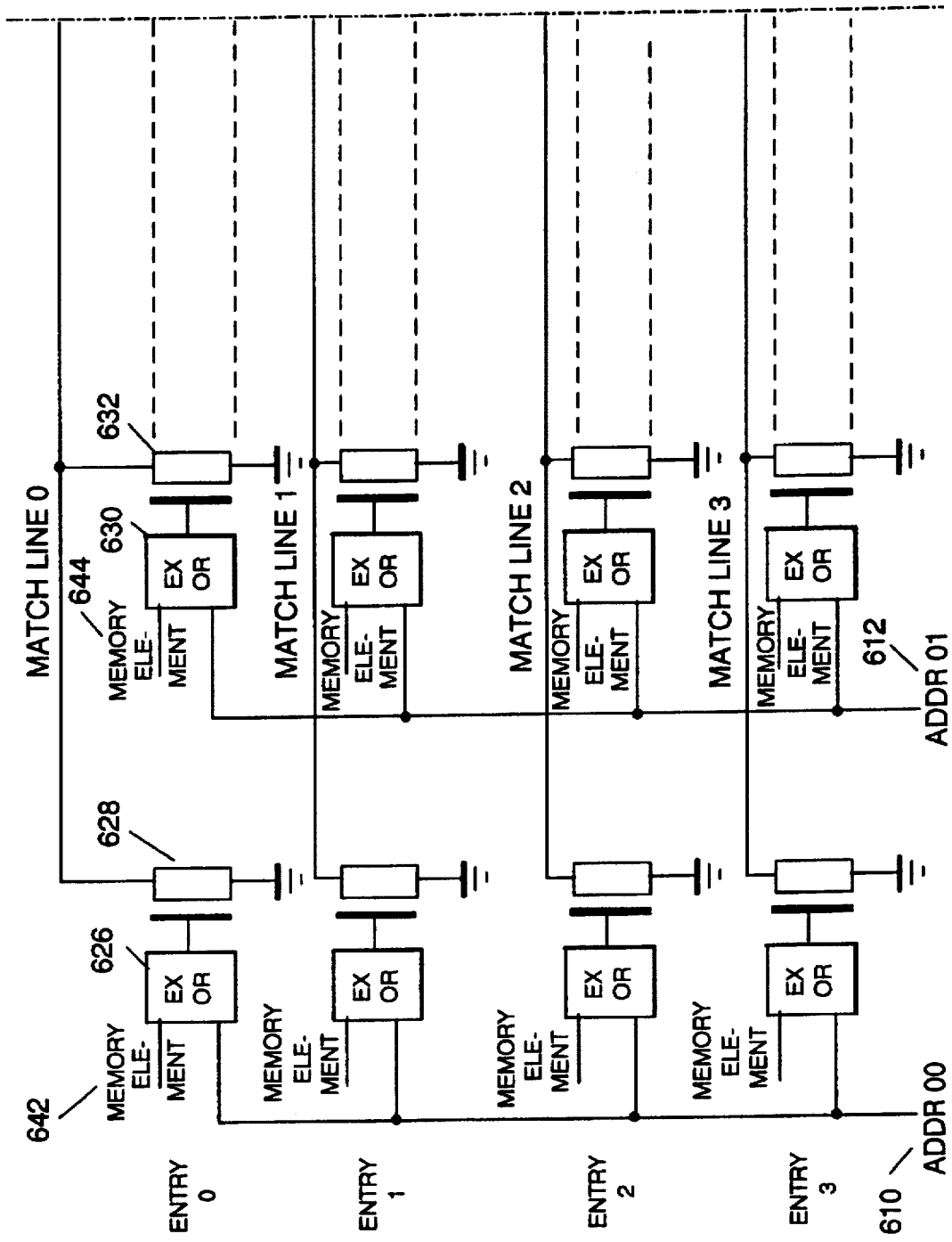
FIG. 6, consisting of FIGS. 6A and 6B, illustrates a compare array of the present invention.
Figure 6B:
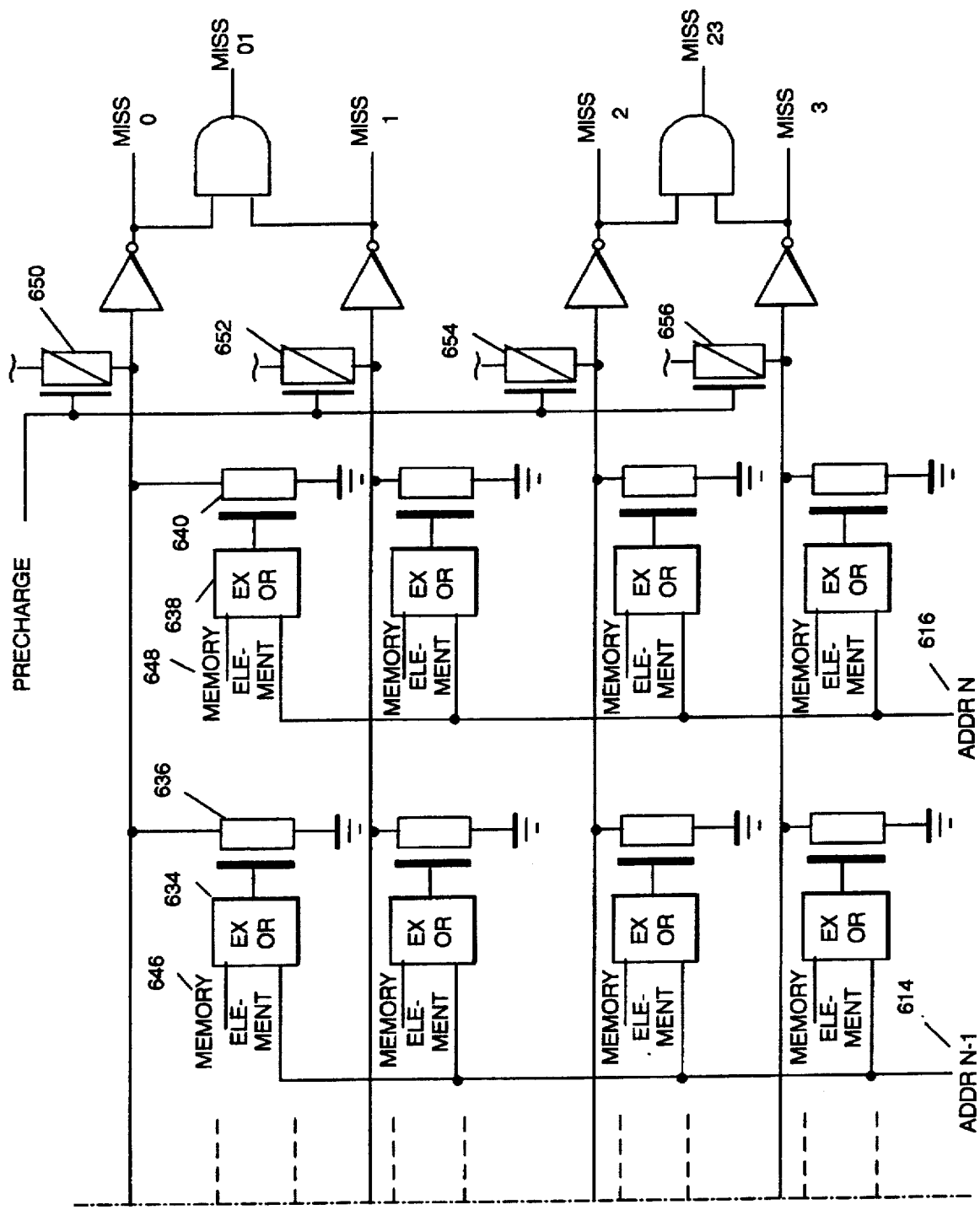
Figure 7A:
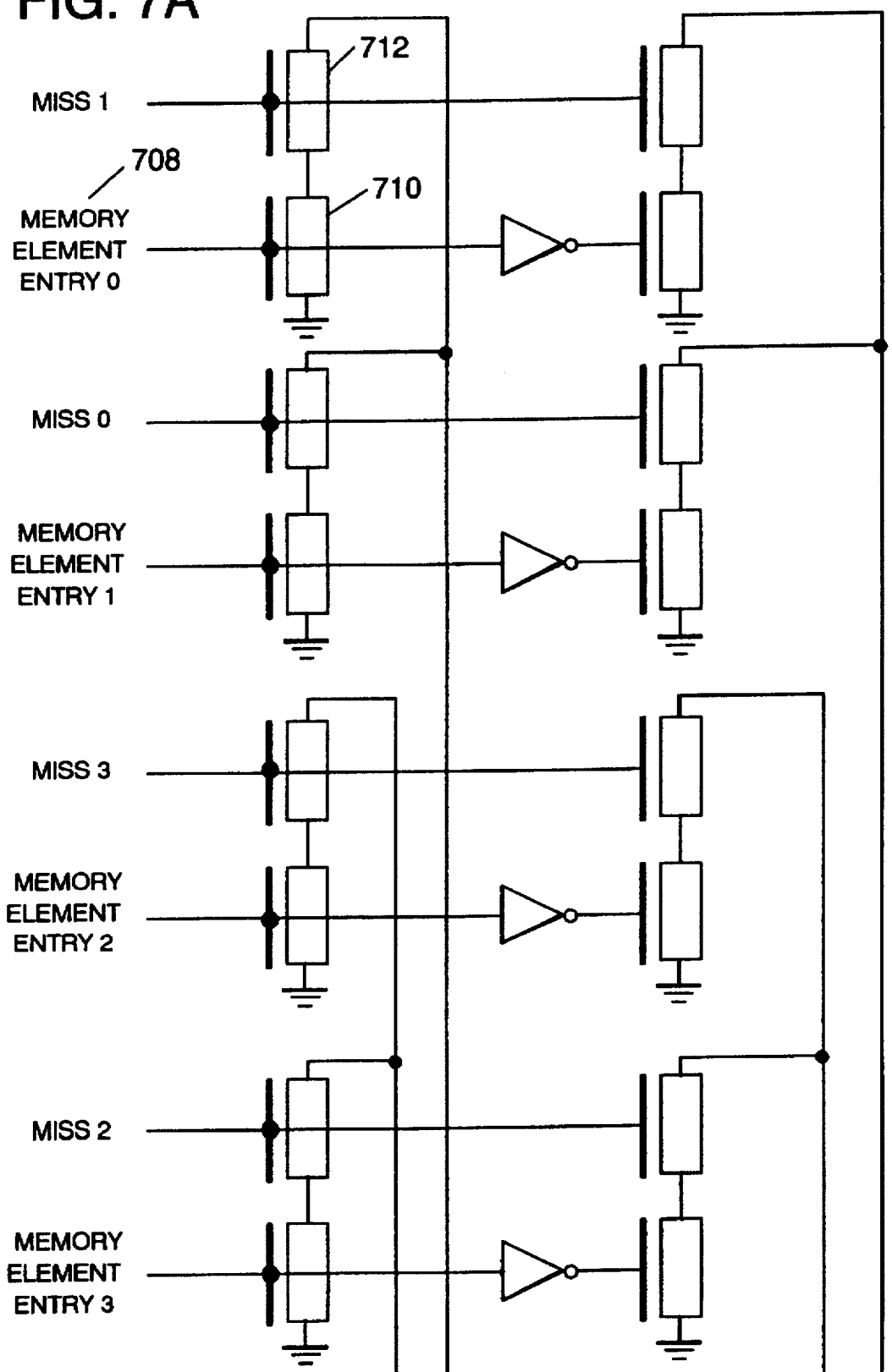
FIG. 7, consisting of FIGS. 7A and 7B, illustrates a memory array bit slice of the present invention.
Figure 7B:
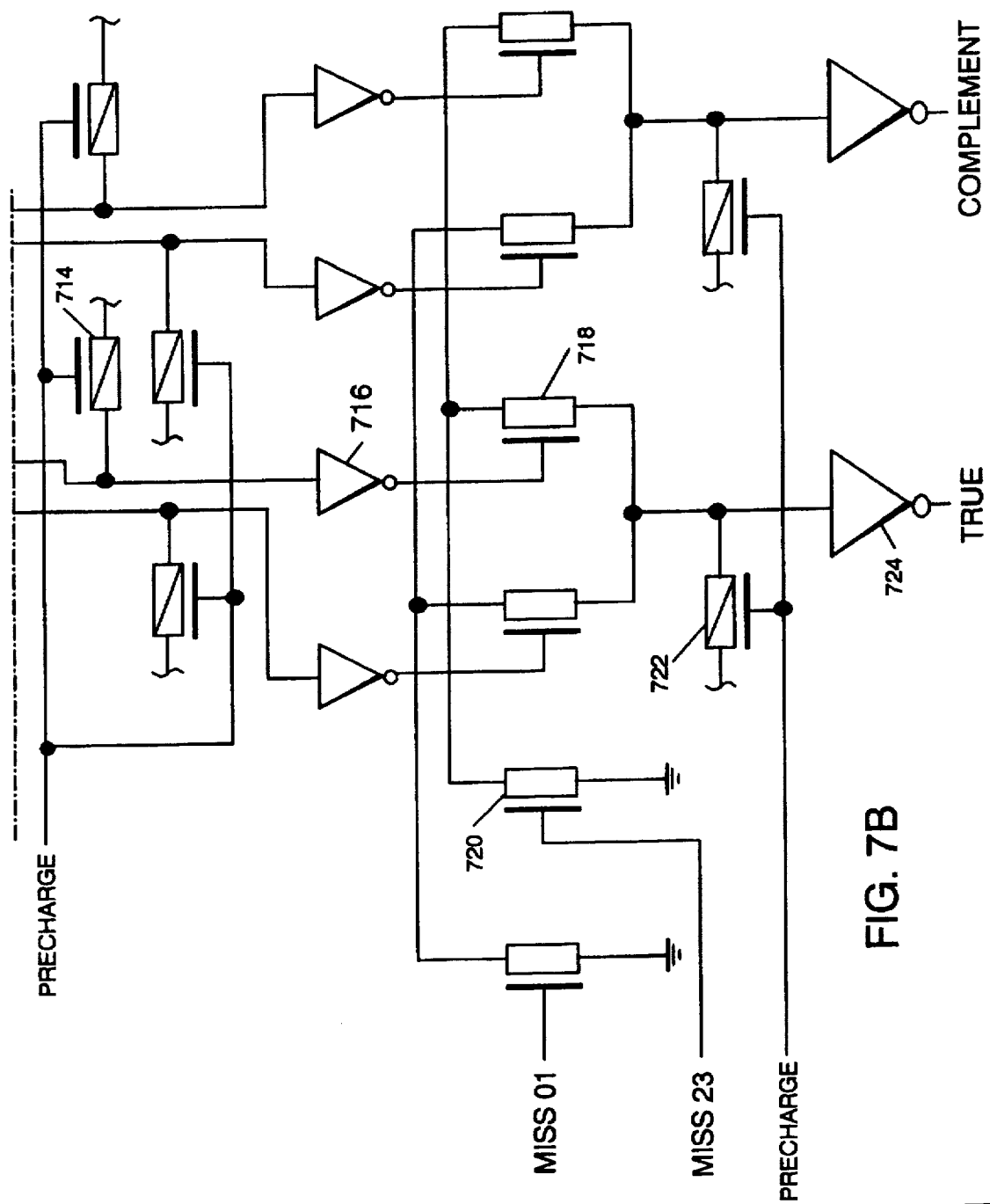
Figure 7:
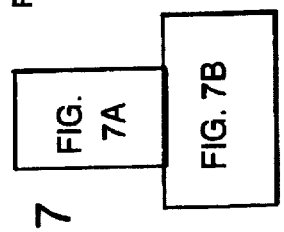

A logic circuit implementing CAM 440 according to the block diagram of FIG. 5 is shown by FIGS. 6 and 7. FIG. 6 shows a preferred embodiment of a compare array while FIG. 7 shows a preferred embodiment of a memory array bit slice. Taken together, these circuits implement the CAM of the present invention.

It is important to note that the circuits shown in FIGS. 6 and 7 are only examples. An inventive compare array like that shown in FIG. 6 can have any number of address lines and entries. Similarly, a memory array can have any number of bit slices like that shown in FIG. 7. In addition, each bit slice can have any number of entries, as long as each entry in the compare array has a corresponding entry in the bit slice. The number of address lines, entries, and bit slices is dependant upon the particular address format and word size used by the data processing system.

FIG. 6,consisting of FIGS. 6A and 6B, shows the circuit used to access the memory array. This circuit determines whether an address matches an entry in the CAM. The circuit of FIG. 6 has four address lines, 610-616 for carrying the bits of the address. In addition, the circuit of FIG. 6 has four entries (labelled entries 0-3) for holding CAM addresses. Each entry, such as entry 0, has four XOR gates 626, 630, 634, 638 and each XOR gate drives the gate of a corresponding NFET 628, 632, 636, 640. Each XOR gate 626, 630, 634, 638 receives input from an associated memory element 642-648 and from a corresponding address line 610-616. The design, loading, and reading of a memory element is well known in the art and need not be discussed herein. The drain of each NFET of an entry is connected to a match line for that entry. For example, the drains of NFETs 628, 632, 636, 640 of entry 0 are connected to match line 0.

A PFET 650-656 precharges each match line to $V_{DD}$ (hereafter referred to as "high " or "1"). In addition, each match line is inverted at its output, producing miss signals 0-3. Furthermore, miss 0 is AND'ed with miss 1 to produce miss signal 01 and miss 2 is AND'ed with miss 3 to produce miss signal 23.

In use, an argument is applied to address lines 610-616. If the signal on an address line does not match a memory element, then the match line for that element is driven low. For example, if address line 610 is 1, and memory element 642 is 0, then XOR gate 626 will supply a high signal to the gate of NFET 628. Then, NFET 628 will drive match line 0 low. Match line 0 is inverted and, accordingly, miss 0 line is high.

If the argument matches all memory elements of an entry, then that entry's match line will remain in the precharged high state. The match line is inverted and, accordingly, that entry's miss line will be low.

FIG. 7,consisting of FIGS. 7A and 7B, shows an inventive memory array bit slice using the miss signals of FIG. 6. Miss signals 0-3, miss 01, and miss 23 are input to the bit slice. The circuit in the bit slice utilizes these input signals to produce true and complement outputs reflecting the state of the bit in the bit slice matching the applied address.

The bit slice in FIG. 7 has four memory elements, one element for each entry in CAM 440. The true and complement signals of each element are connected to the gates of separate NFETs. The drain of each NFET, in turn, is connected to the source of another NFET, which is driven by a miss signal. The drains from the latter NFETs are connected to lines which are precharged high by PFETs and connect with a multiplexer (MUX) that uses the miss 01 and miss 23 signals to select the proper outputs from the bit slice.

For example, memory element 708 drives the gate of NFET 710. The drain of NFET 710, in turn, is connected to the source of NFET 712. The miss 1 line drives the gate of NFET 712. The drain of NFET 712 is connected to a line that is precharged high by PFET 714 and inverted by inverter 716 then connected to the gate of NFET 718. The source of NFET 718 is connected to the drain of NFET 720. NFET 720 is driven by miss 23. The drain of NFET 718 is precharged high by PFET 722, is inverted by inverter 724, and becomes the true output for the bit slice.

Assume that entry 0 of FIG. 6 matches the argument supplied to CAM 440. Therefore, miss 0 and miss 01 are low and miss 1—3 and miss 23 are high. Also assume that memory element 708 has a value of "1".

Therefore, NFET 712 will drive the line connected to inverter 716 low. As a result, NFET 718 will be driven high. Miss 23 is 1, causing NFET 720 to drive the source of NFET 718 low. The signal from the drain of NFET 718 is inverted and the output becomes a 1, which is the proper true value of memory element 708. Those skilled in the art will quickly realize that the circuit of FIG. 7 will provide the correct true and complement outputs in response to any set of possible inputs.

Although the present invention and its advantages have been described in detail, it should be understood that various changes, substitutions and alterations can be made herein without departing from the spirit and scope of the invention as defined by the appended claims.

What is claimed is:

1. A content addressable memory comprising:
  a compare array having a plurality of CAM entries, comprising:
    address receiving means for receiving an address;
    comparing means for comparing the address with the CAM entries to determine whether the address and a CAM entry match; and
    first output means for generating miss output signals for each CAM entry indicating whether the CAM entry matches the address, and for generating combination output signals representing logical combinations of the miss output signals;
  a memory array having a plurality of RAM entries, each RAM entry having a memory element having a value, comprising:
    output receiving means for receiving the miss and combination output signals from the compare array;
    selecting means for selecting a RAM entry from the miss and combination output signals; and
    second output means for generating a RAM output signal from the memory array indicating value of the memory element of the selected RAM entry.

2. The content addressable memory of claim 1, wherein the RAM output signal indicates a true and a complement of the value of the selected RAM entry.

3. The content addressable memory of claim 1, wherein the address receiving means comprises a plurality of address lines.

4. The content addressable memory of claim 1, wherein said comparing means comprises:
  a plurality of CAM memory elements associated with the CAM entry;
  a plurality of XOR gates associated with the CAM entry, each XOR gate receiving input from a CAM memory element and the address receiving means;
  a plurality of NFETs having drains, each NFET being driven by an XOR gate; and
  a match line associated with the CAM entry having high and low states, wherein the drain of each NFET is connected to the match line.

5. The content addressable memory of claim 4, wherein the match line is precharged high and is driven low by a NFET if the input from the CAM memory element received by the XOR gate does not match the input from the address receiving means.

6. The content addressable memory of claim 1, wherein the first output means comprises:
  a plurality of match lines, wherein each match line is associated with a CAM entry and has a state;
  a plurality of inverters, wherein each inverter inverts the state of a match line, thereby creating a miss signal; and
  a plurality of logic gates, wherein each logic gate compares the states of a plurality of miss signals and outputs a combination signal.

7. The content addressable memory of claim 6, wherein the logic gates are AND gates.

8. The content addressable memory of claim 1, wherein the output receiving means comprises a plurality of miss lines received from the first output means.

9. The content addressable memory of claim 1, wherein the selecting means comprises:
  a plurality of first NFETs having sources and drains, wherein each first NFET is associated with a RAM entry and each first NFET is driven by the RAM entry's value;
  a plurality of second NFETs having sources and drains, wherein the source of each second NFET is connected to the drain of a first NFET and each second NFET is driven by a miss output signal received from the compare array; and
  output select means connected to the drains of the second NFETs and to the combination output signals wherein the output select means uses the combination output signals to select the value of the entry matching the address.

10. The content addressable memory of claim 9, wherein the output select means is a multiplexer.

11. A data processing system for retrieving data from a content addressable memory, comprising:
  a processor for sending a memory address request to the content addressable memory;
  a compare array having a plurality of CAM entries, comprising:
    address receiving means for receiving the address;
    comparing means for comparing the address with the CAM entries to determine whether the address and a CAM entry match; and
    first output means for generating miss output signals for each CAM entry indicating whether the CAM entry matches the address, and for generating combination output signals representing logical combinations of the miss output signals;
  a memory array having a plurality of RAM entries, each RAM entry having a memory element having a value, comprising:
    output receiving means for receiving the miss and combination output signals from the compare array;
    selecting means for selecting a RAM entry from the miss and combination output signals; and
    second output means for generating a RAM output signal from the memory array indicating value of the memory element of the selected RAM entry and sending the RAM output signal to the processor.

12. The data processing system of claim 11, wherein the RAM output signal indicates a true and a complement of the value of the selected RAM entry.

13. The data processing system of claim 11, wherein the address receiving means comprises a plurality of address lines.

14. The data processing system of claim 11, wherein said comparing means comprises:
  a plurality of CAM memory elements associated with the CAM entry;

a plurality of XOR gates associated with the CAM entry, each XOR gate receiving input from a CAM memory element and the address receiving means;

a plurality of NFETs having drains, each NFET being driven by an XOR gate; and a match line associated with the CAM entry having high and low states, wherein the drain of each NFET is connected to the match line.

15. The data processing system of claim 14, wherein the match line is precharged high and is driven low by a NFET if the input from the CAM memory element received by the XOR gate does not match the input from the address receiving means.

16. The data processing system of claim 11, wherein the first output means comprises:

a plurality of match lines, wherein each match line is associated with a CAM entry and has a state;

a plurality of inverters, wherein each inverter inverts the state of a match line, thereby creating a miss signal; and a plurality of logic gates, wherein each logic gate compares the states of a plurality of miss signals and outputs a combination signal.

17. The data processing system of claim 16, wherein the logic gates are AND gates.

18. The data processing system of claim 11, wherein the output receiving means comprises a plurality of miss lines received from the first output means.

19. The data processing system of claim 11, wherein the selecting means comprises:

a plurality of first NFETs having sources and drains, wherein each first NFET is associated with a RAM entry and each first NFET is driven by the RAM entry's value;

a plurality of second NFETs having sources and drains, wherein the source of each second NFET is connected to the drain of a first NFET and each second NFET is driven by a miss output signal received from the compare array; and output select means connected to the drains of the second NFETs and to the combination output signals wherein the output select means uses the combination output signals to select the value of the entry matching the address.

20. The data processing system of claim 19, wherein the out means is a multiplexer.

* * * * *

UNITED STATES PATENT AND TRADEMARK OFFICE
CERTIFICATE OF CORRECTION

PATENT NO. : 5,638,315

DATED : June 10, 1997

INVENTOR(S) : BRACERAS et al

It is certified that error appears in the above-indentified patent and that said Letters Patent is hereby corrected as shown below:

Column 8, line 21     Replace "out"
                          With --output select--

Signed and Sealed this

Ninth Day of September, 1997

Attest:

BRUCE LEHMAN

*Attesting Officer*     Commissioner of Patents and Trademarks